(12) United States Patent
Saito et al.

(10) Patent No.: US 9,283,707 B2
(45) Date of Patent: Mar. 15, 2016

(54) METHOD FOR PRODUCING LIQUID-CRYSTALLINE POLYESTER RESIN COMPOSITION

(75) Inventors: Shintaro Saito, Tsukuba (JP); Sadanobu Iwase, Tsuchiura (JP); Hiroshi Harada, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 625 days.

(21) Appl. No.: 12/552,861

(22) Filed: Sep. 2, 2009

(65) Prior Publication Data

US 2010/0060134 A1    Mar. 11, 2010

(30) Foreign Application Priority Data

Sep. 11, 2008 (JP) ................................. 2008-232964

(51) Int. Cl.

| | |
|---|---|
| B29C 47/00 | (2006.01) |
| B29C 47/40 | (2006.01) |
| B29C 47/62 | (2006.01) |
| C08J 3/20 | (2006.01) |
| C08K 3/22 | (2006.01) |
| C08K 9/02 | (2006.01) |
| C09K 19/38 | (2006.01) |
| C09K 19/52 | (2006.01) |
| B29C 47/60 | (2006.01) |
| B29C 47/92 | (2006.01) |
| B29C 47/08 | (2006.01) |
| B29C 47/76 | (2006.01) |
| B29K 67/00 | (2006.01) |
| C08K 7/14 | (2006.01) |
| C08L 67/03 | (2006.01) |
| H01L 51/52 | (2006.01) |

(52) U.S. Cl.
CPC ......... *B29C 47/0004* (2013.01); *B29C 47/0011* (2013.01); *B29C 47/40* (2013.01); *B29C 47/6056* (2013.01); *B29C 47/62* (2013.01); *B29C 47/92* (2013.01); *C08J 3/203* (2013.01); *C08K 3/22* (2013.01); *C08K 9/02* (2013.01); *C09K 19/3809* (2013.01); *C09K 19/52* (2013.01); *B29C 47/0871* (2013.01); *B29C 47/767* (2013.01); *B29C 2947/92704* (2013.01); *B29C 2947/92895* (2013.01); *B29K 2067/00* (2013.01); *C08J 2367/03* (2013.01); *C08K 7/14* (2013.01); *C08L 67/03* (2013.01); *H01L 51/5271* (2013.01)

(58) Field of Classification Search
USPC ......................................................... 264/141
See application file for complete search history.

(56) References Cited

U.S. PATENT DOCUMENTS

| 2004/0165390 A1 | 8/2004 | Sato et al. |
| 2009/0212684 A1 | 8/2009 | Saito et al. |

FOREIGN PATENT DOCUMENTS

| JP | 62-179780 A | 8/1987 |
| JP | 2004-277539 A | 10/2004 |
| JP | 2007-218980 A | 8/2007 |
| JP | 2007-254669 A | 10/2007 |
| WO | 2009/119530 A1 | 10/2009 |

*Primary Examiner* — Larry Thrower
(74) *Attorney, Agent, or Firm* — Sughrue Mion, PLLC

(57) ABSTRACT

The present invention provides a method for producing a liquid-crystalline polyester resin composition, the method comprising providing a twin-screw extrusion granulator that comprises a cylinder provided with at least one supply port and two screws installed in the cylinder; supplying (A) a liquid-crystalline polyester and (B) a titanium oxide filler into the cylinder through one of the at least one supply port; and melt-kneading the components (A) and (B), wherein a cylinder setting temperature is set at a temperature of (Tm−10)° C. or lower wherein Tm is a fluidization temperature of the component (A).

7 Claims, 1 Drawing Sheet

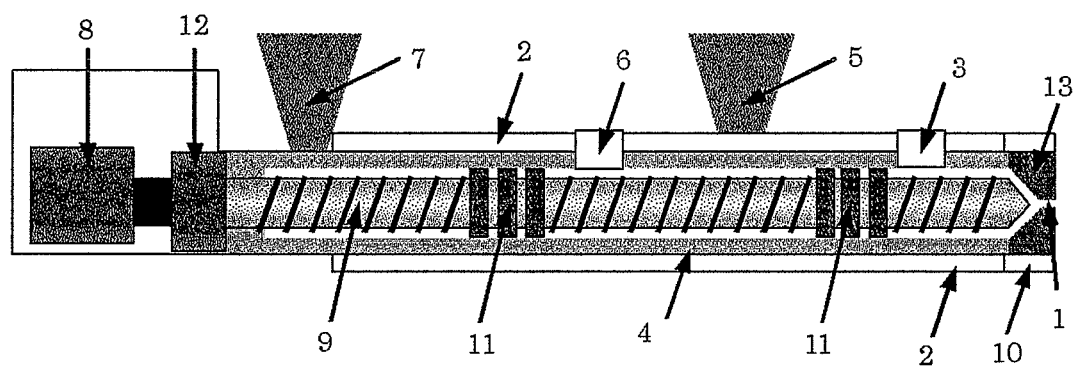

METHOD FOR PRODUCING LIQUID-CRYSTALLINE POLYESTER RESIN COMPOSITION

BACKGROUND OF THE INVENTION

1. Field of the Invention

The present invention relates to a method for producing a liquid-crystalline polyester resin composition preferable for the production of a reflecting plate and a liquid-crystalline polyester resin composition obtained by the production method.

2. Description of the Related Art

As to light reflecting plates used in, for example, LED (light-emitting diode) light-emitting devices, various studies are being made concerning many resin reflecting plates from the viewpoint of processability and light-weight characteristics. As such a resin for producing a reflecting plate made of a resin, a liquid-crystalline polyester resin composition containing a filler (hereinafter referred to as "high-reflectance filler", according to the case) capable of imparting high reflectance to the reflecting plate and a liquid-crystalline polyester has been attracted attentions. This reason is that the liquid-crystalline polyester has excellent characteristics, such as high heat resistance and thin-wall processability required for the production of a reflecting plate. For example, JP-A No. 2007-320996 proposes a liquid-crystalline polyester resin composition obtained by formulating titanium oxide and a blue colorant to a liquid-crystalline polyester and discloses that a molded article obtained using this resin composition has high reflectance and high whiteness and is therefore preferable as reflecting plates used in the vicinity of a light source.

SUMMARY OF THE INVENTION

In the meantime, as a method for industrially producing a liquid-crystalline polyester resin composition, a method (usually called "strand method") is widely used in which a liquid-crystalline polyester and a filler are melt-kneaded, the melted liquid-crystalline polyester resin composition is extruded to form a strand-like composition called a strand, which is then cut into a desired unit length to form pellet granules. However, there is a case where the liquid-crystalline polyester resin composition using a titanium oxide filler as a high-reflectance filler has the occurrence of inferior flow of the strands and the breakdown of the strands during the course of extrusion, so that the strands cannot be obtained stably and the stable production of granules is hindered.

In light of this situation, one of objects of the present invention is to provide a method for producing a granule (pellet) of a liquid-crystalline polyester resin composition stably by sufficiently preventing the flow inferior and breakdown of strands in the production of the liquid crystal resin composition containing a liquid-crystalline polyester and titanium oxide filler by the strand method.

The inventors of the present invention have made earnest studies to solve the above problem, resulting in the completion of the present invention.

The present invention provides a method for producing a liquid-crystalline polyester resin composition, the method comprising:

providing a twin-screw extrusion granulator that comprises a cylinder provided with at least one supply port and two screws installed in the cylinder;
supplying
(A) a liquid-crystalline polyester and
(B) a titanium oxide filler
into the cylinder through one of the at least one supply port; and
melt-kneading the components (A) and (B),
wherein a cylinder setting temperature is set at a temperature of (Tm−10)° C. or lower wherein Tm is a fluidization temperature of the component (A).

Further, using the liquid-crystalline polyester resin composition obtained by the above-described method, the present invention provides a reflecting plate, and also provides a light-emitting device comprising the reflecting plate.

According to the present invention, the flow inferior and breakdown of strands can be sufficiently prevented in the production of a liquid-crystalline polyester resin composition containing a liquid-crystalline polyester and a titanium oxide filler. The strands obtained in this manner are cut into a desired unit length to obtain pellets (granules) having a uniform composition.

Also, the liquid-crystalline polyester resin composition obtained by the production method of the present invention expresses high light reflectance by the synergetic effect of the liquid-crystalline polyester and titanium oxide filler, making it possible to obtain an excellent reflecting plate, which is remarkably useful industrially.

BRIEF DESCRIPTION OF THE DRAWINGS

FIG. 1 is a sectional view showing the typical structure of a twin-screw extrusion granulator.

DETAILED DESCRIPTION OF THE PREFERRED EMBODIMENTS

The production method of the present invention relates to a method for producing a liquid crystal resin composition containing a component (A) and a component (B) by using a twin-screw extrusion granulator and supplying the above components (A) and (B) from the most upstream side supply port of the twin-screw extrusion granulator to melt-knead the mixture, wherein the cylinder setting temperature of the twin-screw extrusion granulator is Tm−10 [° C.] based on the fluidization temperature Tm [° C.] of the component (A).

Hereinafter, preferred embodiments of these components, a method for producing a liquid-crystalline polyester resin composition containing these components, the obtained liquid-crystalline polyester resin composition, a reflecting plate made of the liquid-crystalline polyester resin composition and a light emitting device will be described sequentially.

<Component (A)>

The liquid-crystalline polyester used for the component (A) is a polyester which is called a thermotropic liquid crystal polymer and forms a melt showing optical anisotropy at a temperature of 450° C. or lower. Specific examples of the liquid-crystalline polyester may include:

(1) liquid-crystalline polyesters obtained by combining and polymerizing an aromatic hydroxycarboxylic acid, an aromatic dicarboxylic acid and an aromatic diol;

(2) liquid-crystalline polyesters obtained by polymerizing two or more kinds of aromatic hydroxycarboxylic acids;

(3) liquid-crystalline polyesters obtained by combining and polymerizing an aromatic dicarboxylic acid and an aromatic diol;

(4) liquid-crystalline polyesters obtained by reacting an aromatic hydroxycarboxylic acid with a crystalline polyester such as polyethylene terephthalate; and the like.

In the production of the liquid-crystalline polyester, the above aromatic hydroxycarboxylic acid, aromatic dicarboxylic acid and aromatic diol may be respectively replaced with an ester-forming derivative of each of these compounds. The use of the ester-forming derivatives has an advantage that the liquid-crystalline polyester is produced more easily.

Here, the ester-forming derivative will be briefly described.

Examples of the ester-forming derivatives of an aromatic hydroxycarboxylic acid and an aromatic dicarboxylic acid having a carboxylic group in its molecule may include those obtaining by converting the carboxylic group into a highly reactive acid halide group or an acid anhydride group, those in which the carboxyl group forms esters with alcohols or ethylene glycol in such a manner as to form a polyester by an ester exchange reaction, and the like. Also, examples of the ester-forming derivatives of an aromatic hydroxycarboxylic acid and an aromatic diol having a phenolic hydroxyl group in its molecule may include those in which the phenolic hydroxyl group forms esters with lower carboxylic acids in such a manner as to form a polyester by an ester exchange reaction, and the like.

Moreover, the above aromatic hydroxycarboxylic acid, aromatic dicarboxylic acid or aromatic diol may have a halogen atom such as a chlorine atom or a fluorine atom; an alkyl group such as a methyl group or an ethyl group; or an aryl group such as a phenyl group as a substituent on the aromatic ring to an extent that the ester-forming ability is not impaired.

As a structural unit constituting the liquid-crystalline polyester, the following units may be exemplified. Structural units derived from aromatic hydroxycarboxylic acids:

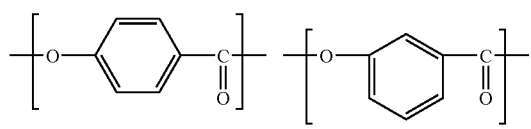
(A$_1$)

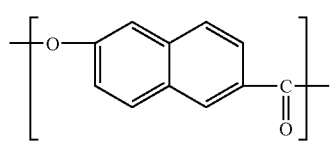
(A$_2$)

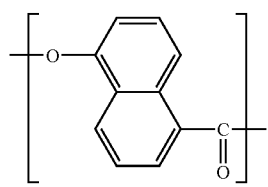

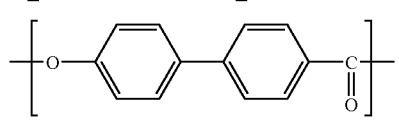

The above structural units may contain a halogen atom, an alkyl group or an aryl group as a substituent.

Structural units derived from aromatic dicarboxylic acids:

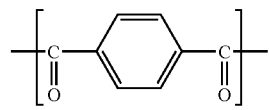
(B$_1$)

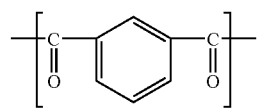
(B$_2$)

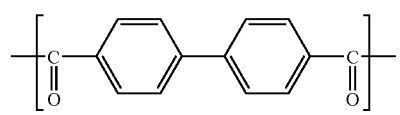
(B$_3$)

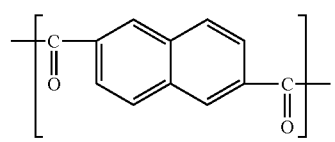

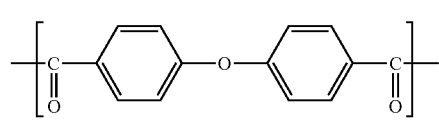

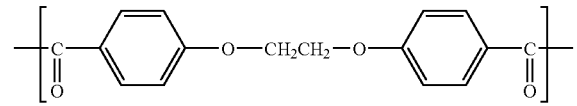

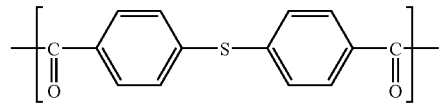

The above structural units may contain a halogen atom, an alkyl group or an aryl group as a substituent.

Structural units derived from aromatic diols:

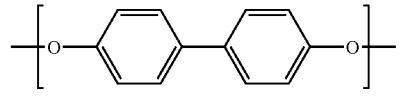
(C$_1$)

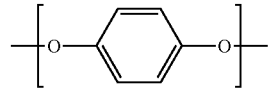
(C$_2$)

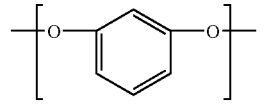
(C$_3$)

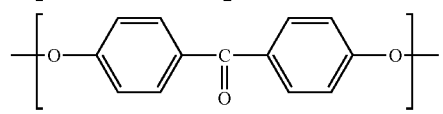

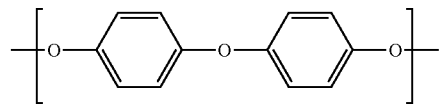

-continued

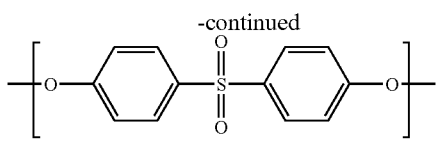

The above structural units may contain a halogen atom, an alkyl group or an aryl group as a substituent.

Preferable examples of a combination of the structural units of the liquid-crystalline polyester may include the following (a) to (h).

(a): A combination of $(A_1)$, $(B_1)$ and $(C_1)$ or a combination of $(A_1)$, $(B_1)$, $(B_2)$ and $(C_1)$;

(b): A combination of $(A_2)$, $(B_3)$ and $(C_2)$ or a combination of $(A_2)$, $(B_1)$, $(B_3)$ and $(C_2)$;

(c): A combination of $(A_1)$ and $(A_2)$;

(d): A combination obtained by replacing a part or all of $(A_1)$ with $(A_2)$ in the combination of the structural units of (a);

(e): A combination obtained by replacing a part or all of $(B_1)$ with $(B_3)$ in the combination of the structural units of (a);

(f): A combination obtained by replacing a part or all of $(C_1)$ with $(C_3)$ in the combination of the structural units of (a);

(g): A combination obtained by replacing a part or all of $(A_2)$ with $(A_1)$ in the combination of the structural units of (b); and (h): A combination obtained by adding $(B_1)$ and $(C_2)$ to the combination of the structural units of (c).

The liquid-crystalline polyester used as the component (A) preferably includes, similarly to the above (a) to (h), $(A_1)$ and/or $(A_2)$ as the structural unit derived from the aromatic hydroxycarboxylic acid, at least any one of $(B_1)$, $(B_2)$ and $(B_3)$ as the structural unit derived from the aromatic diol and at least any one of $(C_1)$, $(C_2)$ and $(C_3)$ as the structural unit derived from the aromatic dicarboxylic acid.

The liquid-crystalline polyester used in the component (A) has a fluidization temperature of preferably 270 to 400° C. and more preferably 300 to 380° C. When the fluidization temperature of the liquid-crystalline polyester used in the component (A) is in the above range, there is an advantage that the obtained reflecting plate scarcely has a drawback such that the reflecting plate itself is easily deformed and a blister (abnormal blistering) is easily formed under a high-temperature circumstance, for example, in a LED module fabrication process or the like when the reflecting plate is used in a light-emitting device using an LED as a light-emitting element, and that the moldability relating to the production of the reflecting plate is favorable.

The fluidization temperature used herein means a temperature at which a heat melt has a melt viscosity of 4800 Pa·sec when the heat melt is extruded from a nozzle at a temperature rise rate of 4° C./min under a load of 9.8 MPa by using a capillary type rheometer provided with a nozzle having an inner diameter of 1 mm and a length of 10 mm. This fluidization temperature is an index showing the molecular weight of a liquid-crystalline polyester well-known in the technical fields (see, Naoyuki Koide (edition) "Liquid Crystal Polymer Synthesis•Molding•Application-", pp 95-105, CMC, published on Jun. 5, 1987).

As a method for producing the liquid-crystalline polyester to be used in the component (A), the method for producing a liquid-crystalline polyester having a YI value of 32 or smaller which has been proposed by the applicant of the present application in JP-A 2004-256673 is desirable though various known methods may be adopted.

The preferable production method which has been proposed in this publication will be specifically described.

A fatty acid anhydride is mixed in a mixture of an aromatic hydroxycarboxylic acid, an aromatic diol and an aromatic dicarboxylic acid and the mixture is allowed to react at 130 to 180° C. in a nitrogen atmosphere to acylate the hydroxyl groups of the aromatic hydroxycarboxylic acid and aromatic diol with the fatty acid anhydride, thereby obtaining an acylated product (acylated aromatic hydroxycarboxylic acid and acylated aromatic diol). Then, the mixture is heated to carry out polymerization condensation such that an ester exchange reaction is caused between the acyl group of the acylated products and the carboxyl groups of the acylated aromatic hydroxycarboxylic acid and aromatic dicarboxylic acid while distilling reaction byproducts out of the reaction system, to produce a liquid-crystalline polyester.

In the mixture of the aromatic hydroxycarboxylic acid, the aromatic diol and the aromatic dicarboxylic acid, the molar ratio of the phenolic hydroxyl group to the carboxyl group is preferably from 0.9 to 1.1.

The amount of the fatty acid anhydride to be used based on the total amount of the phenolic hydroxyl groups of the aromatic diol and aromatic hydroxycarboxylic acid is preferably in an equivalent weight of 0.95 to 1.2 times and more preferably 1.00 to 1.15 times.

If the amount of the fatty acid anhydride to be used is small, there is a tendency that the obtained liquid-crystalline polyester is prevented from coloring whereas if the amount of the fatty acid anhydride is too small, there is a case where an unreacted aromatic diol or aromatic dicarboxylic acid is easily sublimated in the polymerization condensation, causing the reaction system to be clogged. On the other hand, when the amount of the fatty acid anhydride to be used exceeds in an equivalent weight of 1.2 times, there is a fear that the obtained liquid-crystalline polyester is colored, which deteriorates the reflectance of the reflecting plate.

Examples of the fatty acid anhydride include, but are not particularly limited to, acetic acid anhydride, propionic acid anhydride, butyric acid anhydride, isobutyric acid anhydride, valeric acid anhydride, pivalic acid anhydride, 2-ethylhexanoic acid anhydride, monochloroacetic acid anhydride, dichloroacetic acid anhydride, trichloroacetic acid anhydride, monobromoacetic acid anhydride, dibromoacetic acid anhydride, tribromoacetic acid anhydride, monofluoroacetic acid anhydride, difluoroacetic acid anhydride, trifluoroacetic acid anhydride, glutaric acid anhydride, maleic acid anhydride, succinic acid anhydride, β-bromopropionic acid anhydride and the like. These compounds may be used in combination. Acetic acid anhydride, propionic acid anhydride, butyric acid anhydride and isobutyric acid anhydride are preferably used and acetic acid anhydride is more preferably used from the economical point of view and from the viewpoint of handling characteristics.

The ester exchange (polymerization condensation) reaction is carried out with raising the temperature preferably at a rate of 0.1 to 50° C./min in a range from 130 to 400° C. and more preferably at a rate of 0.3 to 5° C./min in a range from 150 to 350° C.

Then, reaction byproducts are distilled out of the system to carry out the ester exchange (polymerization condensation) reaction more smoothly.

As proposed in JP-A 2004-256673, the ester exchange (polymerization condensation) reaction is preferably carry out in the presence of a heterocyclic organic base compound having two or more nitrogen atoms (nitrogen-containing heterocyclic organic base compound) from the viewpoint of producing the liquid-crystalline polyester more smoothly and of suppressing the coloring of the obtained liquid-crystalline polyester. Examples of the nitrogen-containing heterocyclic organic base compound include imidazole compounds, triazole compounds, dipyridyl compounds, phenanthroline compounds, diazaphenanthrene compounds and the like. Among these compounds, imidazole compounds are preferably used from the viewpoint of reactivity and 1-methylimidazole and 1-ethylimidazole are more preferably used because of easy availability.

A catalyst other than the heterocyclic organic base compound may also be used for the purpose of more promoting the ester exchange (polymerization condensation) reaction to increase the rate of polymerization condensation reaction. However, in a case where a metal salt or the like is used as the catalyst, since the metal salt remains as impurities in the liquid-crystalline polyester, when such a crystal liquid polyester is used as the component (A), there is an adverse influence on electronic parts such as a reflecting plate in some cases. Also, in this point, the use of the above nitrogen-containing heterocyclic organic base compound is a particularly preferable embodiment in producing the liquid-crystalline polyester to be used in the component (A).

Examples of the method of further progressing the ester exchange (polymerization condensation) reaction to enhance the degree of polymerization include a method (polymerization under reduced pressure) in which the pressure in a reactor used for the ester exchange (polymerization condensation) reaction is reduced, a method in which the reaction product is cooled and solidified to then pulverize into a powder and the obtained powder is subjected to solid phase polymerization at 250 to 350° C. for 2 to 20 hours, and the like. By raising the degree of polymerization in this method, it is easy to produce a liquid-crystalline polyester having a desirable fluidization temperature. It is preferable to utilize solid-phase polymerization in a point that the facilities are simple.

It is preferable to carry out the polymerization condensation attained by acylation and ester exchange reaction and the polymerization under reduced pressure and solid-phase polymerization for the purpose of improving the degree of polymerization in an atmosphere of inert gas such as nitrogen.

When the liquid-crystalline polyester thus produced has a YI value of 32 or smaller, it is particularly preferable as the component (A). Here, the YI value means a value obtained by measuring a test piece made of the liquid-crystalline polyester by using a colorimeter. The YI value is an index showing the degree of yellowness, which is defined by ASTM-D1925 and can be specifically given by the following equation.

$$YI=[100(1.28X-1.06Z)/Y]$$

wherein, the values of X, Y and Z are tristimulus values of the light source color in the XYZ color system, respectively.

The liquid-crystalline polyester which is obtained by the production method using a nitrogen-containing heterocyclic organic base compound and has a YI value of 32 or smaller is particularly preferable as the component (A). However, a liquid-crystalline polyester mixture which is made to have a YI value of 32 or smaller by mixing plural kinds of liquid-crystalline polyesters may also be used as the component (A). Also in this case, if the YI value of the liquid-crystalline polyester mixture prepared by mixing plural kinds of liquid-crystalline polyesters is measured by the method using a colorimeter, a liquid-crystalline polyester mixture preferable as the component (A) can also be selected.

<Component (B)>

The titanium oxide filler used as the component (B) is a titanium compound which is primarily made of titanium oxide. A material which is called "titanium oxide" in the art and is commercially available as a resin filler may be used as the component (B). In this case, a material which is called titanium oxide and is commercially available as a resin filler may be used as it is and it is unnecessary to exclude unavoidable impurities. As the titanium oxide filler, one which is surface treated as will be described later may also be used.

No particular limitation is imposed on the crystal shape of titanium oxide itself to be contained in the titanium oxide filler and a rutile type, anatase type or a mixture of the both may be used. A titanium oxide filler containing rutile type titanium oxide is preferable and a titanium oxide filler made of rutile type titanium oxide is more preferable from the viewpoint of obtaining a reflecting plate having higher reflectance and improving the weatherability of the reflecting plate.

Though no particular limitation is imposed on the average particle diameter of the titanium oxide filler, it is preferably 0.10 to 0.50 μm, more preferably 0.15 to 0.40 μm and even more preferably 0.18 to 0.30 μm from the viewpoint of the reflectance of the obtained reflecting plate and the dispersibility of the titanium oxide filler in the reflecting plate. As the average particle diameter of the titanium oxide filler, titanium oxide having an optimum particle diameter may be used taking the thickness of the intended reflecting plate into account.

The average particle diameter used herein is a volume average particle diameter determined in the following manner. Specifically, the outward appearance of a titanium oxide filler is measured by a scanning type electron microscope (SEM) and the obtained SEM photograph is subjected to an image analyzer (for example, "Ruzex IIIU" manufactured by Nireco Corporation) to determine a distribution curve by plotting the amount of particles (%) in each particle size interval of primary particles. Then, the degree of accumulation of 50% (average particle diameter) is calculated from the cumulative distribution curve as the volume average particle diameter.

The amount of the component (B) to be formulated in the liquid-crystalline polyester resin composition of the present invention is preferably 20 to 120 parts by weight, more preferably 30 to 100 parts by weight and even more preferably 40 to 80 parts by weight based on 100 parts by weight of the component (A). When the amount of the component (B) is smaller than 20 parts by weight, the reflectance of the obtained reflecting plate is insufficient in some cases. When the amount of the component (B) exceeds 120 parts by weight, there is a tendency that the production of the reflecting plate itself is made to be difficult or there is a case where the characteristics of the liquid-crystalline polyester such as mechanical characteristics and heat resistance can be insufficiently maintained.

When plural kinds of titanium oxide fillers are used as the component (B), the total amount of these titanium oxides is preferably in the above range based on the component (A).

The titanium oxide filler to be used in the component (B) may be surface-treated for the purpose of improving characteristics such as the dispersibility. Though no is particular limitation is imposed on the surface treatment, surface treatment using an inorganic metal oxide is preferable from the viewpoint of improving the dispersibility and weatherability. Aluminum oxide (alumina) is preferable as the inorganic metal oxide. However, a titanium oxide filler which is not surface-treated is preferable from the viewpoint of heat resistance and strength if it is free from coagulation and it is easily handled.

The method for producing a titanium oxide filler as the component (B) is not limited, and a preferable method is a production method which can provide the titanium oxide filler having the above-described average particles diameter. Among such a production method, sulfuric acid process and chlorine process are preferred. More preferred is chlorine process. In the sulfuric acid process, ores (for example, an ilmenite ore, a titanium slag obtained by treating the ilmenite ore or the like), which are titanium sources, is subjected to reacting with sulfuric acid, the resulting sulfate salt are extracted with water to obtain an solution of sulfate salt, which is then cooled, and iron material is removed therefrom, and the sulfate salt in the solution is subjected to hydrolysis to obtain a titanium oxide. In the chlorine process, ores (for example, rutile ore, synthetic rutile obtained from ilmenite ore, or the like), which are titanium sources, are reacted with chlorine at about 1000° C. to obtain a crude titanium tetrachloride, which is then refined by distillation, and then, the titaniumtetrachloride is oxidized by oxygen to obtain titanium oxide. The chlorine process is preferred because a highly purified titanium oxide excellent in whiteness is obtained by distillation of the titanium tetrachloride, and because a rutile-type titanium oxide having a preferable crystal type is easily obtained. Also, in the chlorine process, the condition in the process (oxidation process) for oxidizing the titanium tetrachloride by oxygen is optimized, whereby titanium oxide relatively superior in whiteness is obtained easily. The titanium oxide filler containing such titanium oxide is particularly preferable as the component (B). Also, the chlorine process has an advantage that the production of coarse particles is suppressed, making it easy to obtain a titanium oxide filler having an average diameter preferable as the component (B) by optimizing the condition in the oxidation process.

Examples of the commercially available product of the titanium oxide filler usable as the component (B) may include "TIPAQUE CR-60" and "TIPAQUE CR-58" manufactured by Ishihara Sangyo Kaisha Ltd., "SR-1" manufactured by Sakai Chemical Industry Co., Ltd. Please note that the "TIPAQUE CR-60" and "TIPAQUE CR-58" are titanium oxide fillers obtained by the chlorine process, while the "SR-1" is a titanium oxide fillers obtained by the sulfuric acid process.

<Inorganic Filler Other than Titanium Oxide Filler>

The liquid-crystalline polyester resin composition to be produced in the present invention may be formulated with an inorganic filler (component (C)) other than the titanium oxide filler for the purpose of, for example, improving the mechanical characteristics and the like of a reflecting plate to an extent that the reflectance of the obtained reflecting plate is not significantly impaired.

In this case, the amount of the component (C) to be formulated is preferably 5 to 100 parts by weight and more preferably 5 to 90 parts by weight based on 100 parts by weight of the component (A). When the amount of the component (C) to be formulated exceeds this range, there is a tendency that the color tone of the reflecting plate is deteriorated or the molding processability is deteriorated when a small reflecting plate is molded.

Examples of the inorganic filler include white pigments such as zinc oxide, zinc sulfide and lead white except for titanium oxide; inorganic fibers such as glass fibers, carbon fibers, metal fibers, alumina fibers, boron fibers, titanic acid fibers, wollastonite and asbestos; powders such as silicon dioxide, to calcium carbonate, alumina, aluminum hydroxide, kaolin, talc, clay, mica, glass flake, glass beads, hollow glass beads, dolomite, various metal powders, barium sulfate, potassium titanate and calcined gypsum; and particulate, plate or whisker inorganic fillers of, for example, silicon carbide, alumina, boron nitride, aluminum borate or silicon nitride.

Among these fillers, inorganic fibers such as glass fibers, titanic acid fibers and wollastonite and particulate, plate or whisker inorganic fillers of, for example, silicon dioxide, aluminum borate or silicon nitride and talc are preferable to impart practical mechanical strength to the obtained reflecting plate without significantly deteriorating the reflectance of the reflecting plate. The glass fibers are also useful when taking economic efficiency into account.

Though there is a case where a collecting agent is used in such an inorganic filler, the amount of the collecting agent to be used is preferably smaller form the viewpoint of suppressing deterioration in color tone of the reflecting plate.

The liquid-crystalline polyester resin composition may be formulated with usual additives, for example, releasability improvers such as fluororesins, higher fatty acid ester compounds and fatty acid metal soaps; coloring materials such as dyes and pigments; antioxidants; thermal stabilizers; fluorescent whitening agents; ultraviolet absorbers; antistatic agents; and surfactants to an extent that the object of the present invention is not impaired. Also, additives having external lubricating effects such as higher fatty acids, higher fatty acid esters, higher fatty acid metal salts and fluorocarbon type surfactants may be added.

<Method for Producing Liquid-Crystalline Polyester Resin Composition>

Next, the method for producing the liquid-crystalline polyester resin composition of the present invention will be described.

The twin-screw extrusion granulator used in the present invention (hereinafter referred to as "granulator") is a melt kneading extruder, which may comprise a cylinder provided with two screws and at least one supply port for supplying both the components (A) and (B), the supply port being located upstream in terms of the direction of the extrusion.

As the granulator, there are various types including a same-direction rotating type, a different-direction rotating type and imperfect engaging type according to the rotating form of the screw. Examples of the same-direction type include a single threaded screw type, a double threaded screw type, a triple threaded screw type and the like. The different-direction type includes a parallel axis type, an inclined axis type, and the like. As the granulator used in the present invention, a same-direction rotation double-shaft extruder is particularly preferable.

In present invention, a cylinder setting temperature of the granulator is set at a temperature of $(Tm-10)°$ C. or lower based on the fluidization temperature ($Tm°$ C.) of the component (A). Please note that the "temperature of $(Tm-10)°$ C. or lower" means a temperature that is not higher than a temperature 10° C. lower than Tm ° C. The cylinder setting temperature used herein is the setting temperature of a heating device for heating the cylinder, the heating device being installed for heating the cylinder at its portion of from the most downstream end to about two-thirds of the cylinder length from the end. As the heating device installed in the granulator, the types conventionally used in the art may be used. Examples of these hating devices include an aluminum casting heater, a brass casting heater, a band heater, a space heater and the like. The granulator may be provided with plural heating devices. In this case, the cylinder setting temperature defined in the present invention means an average of the setting temperatures of all the heating devices which are installed at the cylinder at its portion of from the most downstream end to about two-thirds of the cylinder length from the end. While there is a case where another heater (nozzle heater) is installed at a nozzle (which is a strand discharge port of the granulator), the setting temperature of the nozzle heater is not taken into account for the cylinder setting temperature of the present invention.

In the production method of the present invention, the cylinder setting temperature is designed in the above range, which ensures that a strand containing the components (A) and (B) is stably extruded from the granulator. Though the reason why such effects are produced is not clarified, the inventors of the present invention estimate as follows. That is, titanium oxide or the surface treating agent of titanium oxide contained in the component (B) acts like a catalyst to make it easy to cut the ester bond of the liquid-crystalline polyester, thereby promoting the formation of low-molecular weight components of the liquid-crystalline polyester. When the formation of low-molecular weight components of the liquid-crystalline polyester are produced, the produced low-molecular weight components are gasified during extrusion, causing the strands to be brittle. According to the production method of the present invention, the formation of low-molecular weight components of the liquid-crystalline polyester is well suppressed, thereby making it possible to attain the stabilization of the strands. The cylinder setting temperature is preferably (Tm−15)° C. or lower and more preferably (Tm−20)° C. or lower, based on the Tm° C. The lower limit of the cylinder setting temperature is preferably (Tm−50)° C. or higher, and more preferably (Tm−30)° C. or higher, since it is determined in a range where the components (A) and (B) can be kept in a molten state. If the cylinder setting temperature is more than the lower limit, the load on the granulator is kept in a practical range and there is therefore a tendency that the abrasions of the screw and the cylinder installed in the granulator can be suppressed satisfactorily.

When the component (C) as mentioned above is used besides the components (A) and (B) in the liquid-crystalline polyester resin composition obtained in the present invention, the component (C) is preferably supplied from the downstream side supply port located on the downstream side of the upstream side supply port in the granulator in the direction of extrusion. This reason is that when a titanium oxide filler having a desired average particle diameter is used as the component (B), the titanium filler has characteristics that it has relatively large hardness, and therefore, the component (C) is significantly lost in the melt-kneading if the amount of a fine titanium oxide filler to be filled is large. For example, if a fibrous filler such as glass fibers is used as the component (C), the fibrous filler is easily broken, and as a result, the mechanical strength-improving effect expected for the fibrous filler is lowered, causing a reduction in the strength of a reflecting plate and the like.

In the granulator used in this case, the screw disposed downstream of the downstream side supply port is preferably a substantially forward screw with respect to the direction of extrusion. The components (A) and (B) are transported efficiently in the direction of extrusion, so that the formation of low-molecular weight components of the component (A) liquid-crystalline polyester is well suppressed, making it possible to further stabilize strands. Here, the forward screw with respect to the direction of extrusion used herein means a screw which transports the components (A) and (B) in the is direction of extrusion when the screw is rotated and examples of the forward screw may include a full-flight screw. It is preferable to use a granulator provided with a kneading part at each of the upstream side and the downstream side of the downstream side supply port from the viewpoint of more improving the dispersibility of the component (B) in the obtained liquid-crystalline polyester resin composition. The kneading part means a part which is disposed at a part of the screw to carry out melt-kneading in an efficient manner. Examples of the kneading part may include kneading disks (right kneading disk, neutral kneading disk and left kneading disk), mixing screw and the like.

Hereinafter, the production method of the present invention will be described with reference to the drawings. FIG. 1 is a schematic sectional view showing an embodiment of a granulator to be used in the present invention.

This granulator is provided with a cylinder 4 having a cylindrical form and a screw 9 installed in the cylinder 4 and rotated by a driving motor 8 at a revolution decelerated by a transmission 12. The cylinder 4 is heated by an external heater 2. The screw 9 is provided with a kneading part 11 for kneading the components (A) and (B) and, the component (C) used if necessary at a part thereof.

The cylinder 4 is provided with an upstream side supply port 7 from which the components (A) and (B) are supplied at is its end opposite to the direction of extrusion and also provided with a downstream side supply port 5, from which the component (C) is supplied, in the downstream of this upstream side supply port 7. Also, though not shown in the drawing, the upstream side supply port 7 is sometimes provided with a stationary feeder for supplying the components (A) and (B) quantitatively, and the downstream side supply port 5 is sometimes provided with a fixed quantity feeder for supplying the component (C) quantitatively.

Also, the cylinder 4 is provided with vents 3 and 6 for the purpose of carrying out vacuum deaeration using a vacuum pump or releasing the air into the atmosphere. In order to remove the generated gas efficiently, it is practically preferable to carryout vacuum deaeration from the vent 3 disposed downstream. The cylinder 4 is provided with a nozzle 1 for extruding the strands of the liquid-crystalline polyester resin composition obtained by the melt-kneading. The nozzle 1 is commonly a type having several holes having a hole diameter of 2 mm to 5 mm though depending on the scale of the granulator to be used.

In the production method of the present invention, the components (A) and (B) are supplied from the upstream side supply port 7 and the component (C) is supplied from the downstream side supply port 5. However, a part of the component (C) may be supplied from the upstream side supply port 7 or a part of the components (A) and/or (B) may be supplied from the downstream side supply port 5. In this case, the amount of the component (A) to be supplied from the upstream side supply port 7 is 90% or more of the total amount of the component (A) to be supplied and the amount of the component (B) to be supplied from the upstream side supply port 7 is 90% or more of the total amount of the component (B) to be supplied.

The components (A) and (B) to be supplied to the granulator may be supplied from the upstream side supply port 7 after these components are mixed in advance by using a Henschel mixer, a tumbler or the like.

Although the extrusion speed relating to the melt-kneading is suitably optimized according to the types of the components (A) and (B) to be used, the amounts of these components to be formulated and the type of the granulator, the extrusion speed is preferably higher to hinder the liquid-crystalline polyester resin composition from being significantly affected by heat history.

In this manner, the strand extruded from the granulator may be cut by various known means to give pellet-like granules (pellet). The strand may be cooled by air-cooling or water-cooling to solidify before it is cut. Although no particular limitation is imposed on the cutter used for the cutting, it is general to use a cutter made of a rotary knife and a stationary knife.

In the case of using the additives together with the liquid-crystalline polyester resin composition, these additives and the components (A) and (B) may be supplied to the granulator at the same time or may be mixed with the granules (pellet) obtained after the melt-kneading. In the production of a reflecting plate as will be described later, a method is preferable in which the additives are mixed with the granule obtained after the melt-kneading from the viewpoint of making the reflectance of the obtained reflecting plate favorable.

<Reflecting Plate>

The liquid-crystalline polyester resin composition obtained by the production method of the present invention may be used to produce a reflecting plate which is preferably usable for light-emitting devices and the like by various conventional molding means. In the molding relating to the production of a reflecting plate, injection molding is particularly preferable though the injection molding, an injection compression molding method, an extrusion molding method or the like may be used. In the present invention, the injection molding may be conducted at a molding temperature (nozzle setting temperature) in a range of from (Tm−25)° C. to (Tm+25)° C., preferably at a temperature in a range of from (Tm−25)° C. to (Tm+25)° C., more preferably at a temperature in a range from (Tm−15)° C. to (Tm+15)° C., and most preferably at a temperature in a range from (Tm−10)° C. to (Tm+10)° C., based on the fluidization temperature Tm ° C. of the component (A). When the molding temperature is lower is than the above temperature range, the fluidity of the liquid-crystalline polyester resin composition is extremely impaired and this tends to cause deterioration in moldability and a reduction in the strength of the reflecting plate. On the other hand, when the molding temperature exceeds the above temperature range, the liquid-crystalline polyester used in the component (A) is significantly deteriorated and this tends to cause a reduction in the reflectance of the reflecting plate.

When the liquid-crystalline polyester resin composition obtained in the present invention is used for molding by, for example, injection molding, a relatively small reflecting plate having a thin-wall part about 0.03 mm to 3 mm in thickness can be easily produced. This thickness is preferably 0.05 to 2 mm and more preferably 0.05 to 1 mm.

The reflecting plate obtained in the present invention has a high reflectance with respect to visible light, especially with respect to blue light in a range of visible light. For example, the reflecting plate in the present invention may have a reflectance of 70% or more, preferably has a reflectance of 75% or more, more preferably has a reflectance of 80% or more, with respect to light having a wavelength of 460 nm. Please note that the reflectance can be determined by Total Light Reflectance Measuring Method A in JIS K7105-1981 using a standard white plate made of barium sulfate.

<Light-Emitting Device>

The reflecting plate thus obtained can be preferably used as a reflecting plate which needs to reflect the light used in, for example, electric, electronic, automobile and mechanical fields, and particularly, light in the visible light region. The reflecting plate may be preferably used for lamp reflectors of light source devices such as a halogen lamp and an HID, and also for reflecting plates of light-emitting devices and display devices using light-emitting elements such as LEDs or organic ELs. Particularly, in light-emitting devices using an LED as the light-emitting elements, the reflecting plate is sometimes exposed to a high temperature environment such as those in an element packaging process and soldering process during the course of the production process. However, the reflecting plate of the present invention has an advantage that it produces no deformation such as blistering even if it is subjected to the high temperature process. Therefore, when the reflecting plate obtained by the present invention is used in a light-emitting device using an LED as the light-emitting element, the light-emitting device superior in characteristics such as luminescence can be obtained.

The invention being thus described, it will be apparent that the same may be varied in many ways. Such variations are to be regarded as within the spirit and scope of the invention, and all such modifications as would be apparent to one skilled in the art are intended to be within the scope of the following claims.

EXAMPLES

The present invention is described in more detail by following Examples, which should not be construed as a limitation upon the scope of the present invention. The properties or the like of the products (obtained in Examples and Comparative Examples) were measured in the following method.

Reflectance:

The diffuse reflectance of the surface of a reflecting plate test piece having 64 mm×64 mm×1 mm was measured for the light having a wavelength of 460 nm by using an automatic spectrophotometer (U-3500, manufactured by Hitachi, Ltd.). The reflectance is a relative value when the diffuse reflectance of a standard white board of barium sulfate is set to be 100%.

Tensile Strength:

An ASTM No. 4 dumbbell was produced by injection molding to measure the tensile strength according to ASTMD638.

Granulation:

The granulation was found in the following manner. That is, a twin-screw melt-kneading extruder was used as a granulator to carry out melt-kneading of a liquid-crystalline polyester resin composition and visually confirm the number of breakdowns of a strand extruded from the nozzle. Then, a case where almost no breakdown of the strand was observed was rated as "O" and a case where many breakdowns of the strand were observed was rated as "x".

The fillers used to obtain test pieces of reflecting plates in Examples and Comparative Examples are as follows.

Titanium Oxide Filler:

TIPAQUE CR-60, manufactured by Ishihara Sangyo Kaisha Ltd., alumina surface treated product, average particle diameter: 0.21 μm (hereinafter abbreviated as "CR-60");

TIPAQUE CR-58, manufactured by Ishihara Sangyo Kaisha Ltd., alumina surface treated product, average particle diameter: 0.28 μm (hereinafter abbreviated as "CR-58");

SR-1, manufactured by Sakai Chemical Industry Co., Ltd., alumina surface treated product, average particle diameter: 0.26 μm (hereinafter abbreviated as "SR-1"); and Glass Fiber:

CS03JAPX-1, manufactured by Owens Corning Japan Ltd.
EFDE50-01, manufactured by Central Glass Co., Ltd.
EFH75-01, manufactured by Central Glass Co., Ltd.

Example 1

A reactor equipped with a stirrer, a torque meter, a nitrogen gas introducing tube, a thermometer and a reflux condenser was charged with 994.5 g (7.2 mol) of parahydroxybenzoic acid, 446.9 g (2.4 mol) of 4,4'-dihydroxybiphenyl, 299.0 g (1.8 mol) of terephthalic acid, 99.7 g (0.6 mol) of isophthalic acid and 1347.6 g (13.2 mol) of acetic acid anhydride, to which 0.2 g of 1-methylimidazole was then added. After the atmosphere in the reactor was sufficiently replaced with nitrogen gas, the mixture was heated to 150° C. in a nitrogen gas stream over 30 minutes and was then refluxed for one hour while keeping this temperature.

Then, 0.9 g of 1-methylimidazole was added to the reaction mixture, which was then heated up to 320° C. over 2 hours and 50 minutes while distilling distillate byproduct acetic acid and unreacted acetic acid anhydride. The time at which a rise in torque was seen was defined as the termination of the reaction. When the reaction was finished, the reaction mixture was cooled to ambient temperature to obtain a prepolymer of a liquid-crystalline polyester.

After the obtained prepolymer was pulverized by a coarse pulverizer, the powder after pulverization was heated from ambient temperature to 250° C. over one hour, heated from 250° C. to 285° C. over 5 hours and then kept at 285° C. for 3 hours under a nitrogen atmosphere to carryout solid-phase polymerization. The obtained polymer was cooled to obtain a liquid-crystalline polyester 1. The fluidization temperature of the liquid-crystalline polyester 1 was 333° C.

A titanium oxide filler and an inorganic filler were mixed with the obtained liquid-crystalline polyester 1 in the amounts shown in Table 1. Then, the resulting mixture was supplied into a cylinder of a twin-screw extruder (PCM-30, manufactured by Ikegai Ltd., cylinder setting temperature: 320° C.) thorough the upstream-side supply port and was melt-extruded to obtain a strand of a liquid-crystalline polyester resin composition, which was then cut to produce pellets thereof. The twin-screw extruder PCM-30 has three heating devices C1-C3 at a cylinder therein. The C2 and C3 correspond to the heating devices installed for heating the cylinder at its portion of from the most downstream end to about two-thirds of the cylinder length from the end. Therefore, the cylinder setting temperature was determined by calculating an average of the setting temperatures of C2 and C3.

The obtained pellets were dried at 120° C. for 3 hours in an oven and then, molded using an injection molding machine (PS40E5ASE-model, manufactured by Nissei Plastic Industrial Co., Ltd.) at a melt temperature of 340° C. to obtain a test piece for measuring reflectance. In this case, a metal mold with a mirror-finished surface was used for producing this test piece. The same injection molding conditions were used to mold, thereby obtaining an ASTM No. 4 dumbbell for measuring tensile strength. The results of the reflectance and tensile strength measured using these test pieces and dumbbells are shown in Table 1. Also, the setting temperatures of all the heating devices of the twin-screw extruder are shown respectively in Table 2.

Examples 2 and 3, and Comparative Examples 1 to 3

Various fillers were added to the liquid-crystalline polyester 1 used in Example 1 in the amounts shown in Table 1. Then, pellets of liquid-crystalline polyester resin compositions were obtained in the same manner as in Example 1 except that the cylinder setting temperatures were changed in Comparative Examples 1 to 3 as shown in Table 1. The obtained pellets were injection-molded in the same manner as in Example 1 except that the molding temperatures were changed in Example 2 as shown in Table 1, to obtain test pieces for measuring reflectance and an ASTM No. 4 dumbbell for measuring tensile strength. The results of the reflectance and tensile strength measured using these test pieces and dumbbells are shown in Table 1. Also, the setting temperatures of the heating devices of the twin-screw extruder are shown in Table 2.

Examples 4 to 7 and Comparative Example 4

Titanium oxide fillers were mixed with the liquid-crystalline polyester 1 used in Example 1 in the amounts shown in Table 1. The resulting mixtures were each supplied into a cylinder of a twin-screw extruder (PMT-47, manufactured by IKG Corporation) through the upstream-side supply port, and then glass fibers were further supplied thereto through another supply port located downstream from the supply port for supplying the mixture of the titanium oxide filler and the liquid-crystalline polyester, and then were each melt-extruded at each cylinder setting temperature as shown in Table 1, to respectively obtain a strand of a liquid-crystalline polyester resin composition, which was then cut to produce pellets thereof. The twin-screw extruder PMT-47 has nine heating devices C11-C19 at a cylinder therein. The C14 to C19 correspond to the heating devices installed for heating the cylinder at its portion of from the most downstream end to about two-thirds of the cylinder length from the end. Therefore, the cylinder setting temperature was determined by calculating an average of the setting temperatures of C14 to C19.

The obtained pellets were dried at 120° C. for 3 hours in an oven and then, molded using an injection molding machine (PS40E5ASE-model, manufactured by Nissei Plastic Industrial Co., Ltd.) at the mold temperature shown in Table 1 to obtain a test piece for measuring reflectance. In this case, a metal mold with a mirror-finished surface was used for producing this test piece. The same injection molding conditions were used to mold, thereby obtaining an ASTM No. 4 dumbbell for measuring tensile strength. The results of the reflectance and tensile strength measured using these test pieces and dumbbells are shown in Table 1. Also, the setting temperatures of all the heating devices of the twin-screw extruder are shown respectively in Table 3.

Example 8

Another test piece and another ASTM No. 4 dumbbell of a liquid-crystalline polyester resin composition were obtained in the same manner as in Example 4 except that a twin-screw extruder (TEM 41SS, manufactured by Toshiba Machine Co., Ltd.) was used instead of using the twin-screw extruder PMT-47. The twin-screw extruder TEM 41SS has twelve heating devices C21-C32 at a cylinder therein. The C25 to C32 correspond to the heating devices installed for heating the cylinder at its portion of from the most downstream end to about two-thirds of the cylinder length from the end. Therefore, the cylinder setting temperature was determined by calculating an average of the setting temperatures of C25 to C32. The results of the reflectance and tensile strength measured using these test pieces and dumbbells are shown in Table 1. Also, the setting temperatures of all the heating devices of the twin-screw extruder are shown respectively in Table 4.

TABLE 1

|  |  | Example 1 | Comparative Example 1 | Comparative Example 2 | Example 2 | Example 3 | Comparative Example 3 |
|---|---|---|---|---|---|---|---|
| Liquid-crystalline polyester 1 | wt % | 100 | 100 | 100 | 100 | 100 | 100 |

TABLE 1-continued

|  |  |  |  |  |  |  |  |
|---|---|---|---|---|---|---|---|
| CR-60 | wt % | 80 | 80 | 80 | — | — | — |
| CR-58 | wt % | — | — | — | 55 | — | — |
| SR-1 | wt % | — | — | — | — | 80 | 80 |
| CS03-JAPX-1 | wt % | 20 | 20 | 20 | 27 | 20 | 20 |
| Granulator |  |  |  |  | PCM30 |  |  |
| Cylinder setting temperature | ° C. | 320 | 330 | 350 | 320 | 320 | 350 |
| Molding temperature | ° C. | 340 | 340 | 340 | 330 | 340 | 340 |
| Reflectance (%) | 460 nm | 83.7 | 83.6 | 83.0 | 86.0 | 83.6 | 83.3 |
| Granulation |  | ○ | x | x | ○ | ○ | x |
| Tensile strength | MPa | 83 | — | — | 103 | 86 | — |

|  |  | Example 4 | Example 5 | Example 6 | Example 7 | Comparative Example 4 | Example 8 |
|---|---|---|---|---|---|---|---|
| Liquid-crystalline polyester 1 | wt % | 100 | 100 | 100 | 100 | 100 | 100 |
| CR-60 | wt % | — | — | — | — | — | — |
| CR-58 | wt % | 55 | 55 | 55 | 55 | 55 | 55 |
| SR-1 | wt % | — | — | — | — | — | — |
| CS03-JAPX-1 | wt % | 27 | 27 | 27 | 27 | 27 | 27 |
| Granulator |  |  |  | PMT47 |  |  | TEM41SS |
| Cylinder setting temperature | ° C. | 318 | 318 | 318 | 328 | 348 | 310 |
| Molding temperature | ° C. | 320 | 330 | 340 | 330 | 330 | 330 |
| Reflectance (%) | 460 nm | 86.6 | 86.5 | 86.0 | 86.0 | 85.0 | 87.4 |
| Granulation |  | ○ | ○ | ○ | ○ | x | ○ |
| Tensile strength | MPa | — | 113 | — | 113 | — | 115 |

TABLE 2

| Heating device | Setting temperature (° C.) | | |
|---|---|---|---|
|  | Examples 1 to 3 | Comparative Example 1 | Comparative Examples 2 and 3 |
| C1 | 300 | 310 | 330 |
| C2 | 320 | 330 | 350 |
| C3 | 320 | 330 | 350 |
| Nozzle | 320 | 350 | 330 |
| Average temperature of C2 and C3 | 320 | 330 | 350 |

TABLE 3

| Heating device | Setting temperature (° C.) | | |
|---|---|---|---|
|  | Examples 4 to 6 | Example 7 | Comparative Example 4 |
| C11 | 250 | 250 | 250 |
| C12 | 310 | 320 | 340 |
| C13 | 310 | 320 | 340 |
| C14 | 310 | 320 | 340 |
| C15 | 320 | 330 | 350 |
| C16 | 320 | 330 | 350 |
| C17 | 320 | 330 | 350 |
| C18 | 320 | 330 | 350 |
| C19 | 320 | 330 | 350 |
| Nozzle (dice) | 330 | 330 | 350 |
| Average temperature of C14 to C19 | 318 | 328 | 348 |

TABLE 4

| Heating device | Setting temperature (° C.) Example 8 |
|---|---|
| C21 | 250 |
| C22 | 300 |
| C23 | 300 |
| C24 | 310 |
| C25 | 310 |
| C26 | 310 |
| C27 | 310 |
| C28 | 310 |
| C29 | 310 |
| C30 | 310 |
| C31 | 310 |
| C32 | 310 |
| Nozzle (dice) | 320 |
| Average temperature of C25 to C32 | 310 |

Example 9

A reactor equipped with a stirrer, a torque meter, a nitrogen gas introducing tube, a thermometer and a reflux condenser was charged with 994.5 g (7.2 mol) of parahydroxybenzoic acid, 446.9 g (2.4 mol) of 4,4'-dihydroxybiphenyl, 358.8 g (2.16 mol) of terephthalic acid, 39.9 g (0.24 mol) of isophthalic acid and 1347.6 g (13.2 mol) of acetic acid anhydride, to which 0.2 g of 1-methylimidazole was then added. After the atmosphere in the reactor was sufficiently replaced with nitrogen gas, the mixture was heated to 150° C. in a nitrogen gas stream over 30 minutes and was refluxed for one hour while keeping this temperature.

The reaction mixture was then heated up to 320° C. over 2 hours and 50 minutes while distilling distillate byproduct acetic acid and unreacted acetic acid anhydride. The time at which a rise in torque was seen was defined as the termination of the reaction. When the reaction was finished, the reaction mixture was cooled to ambient temperature to obtain a prepolymer.

After the obtained prepolymer was pulverized by a coarse pulverizer, the powder after pulverization was heated from ambient temperature to 250° C. over one hour, heated from 250° C. to 305° C. over 5 hours and then kept at 305° C. for 3 hours under a nitrogen atmosphere to carry out solid-phase polymerization. The obtained polymer was cooled to obtain a liquid-crystalline polyester 2. The fluidization temperature of the liquid-crystalline polyester 2 was 363° C.

A titanium oxide filler and an inorganic filler were mixed with the obtained liquid-crystalline polyester 2 in the amounts shown in Table 5. Then, the resulting mixture was supplied into the cylinder of the twin-screw extruder PCM-30 thorough the upstream-side supply port and was melt-extruded while setting a cylinder setting temperature of 340° C., to obtain a strand of a liquid-crystalline polyester resin composition, which was then cut to produce pellets thereof.

Using the obtained pellets, a test piece and an ASTM No. 4 dumbbell of the liquid-crystalline polyester resin composition were obtained in the same manner as in Example 1 except that the injection-molding temperature was changed from 340° C. to 360° C. The results of the reflectance and tensile strength measured using the test piece and dumbbell are shown in Table 5. Also, the setting temperatures of all the heating devices of the twin-screw extruder are shown respectively in Table 6.

Examples 10 to 12, and Comparative Examples 5 and 6

Various fillers were mixed with the liquid-crystalline polyester 2 used in Example 9 in the amounts shown in Table 5. Then, pellets of liquid-crystalline polyester resin compositions were obtained in the same manner as in Example 9 except that the cylinder setting temperatures were changed in Example 10 and Comparative Examples 5 and 6 as shown in Table 5. The obtained pellets were injection-molded in the same manner as in Example 9, to obtain test pieces for measuring reflectance and an ASTM No. 4 dumbbell for measuring tensile strength. The results of the reflectance and tensile strength measured using these test pieces and dumbbells are shown in Table 5. Also, the setting temperatures of the heating devices of the twin-screw extruder are shown in Table 6.

Example 13

A titanium oxide filler was mixed with the liquid-crystalline polyester 2 used in Example 9 in the amounts shown in Table 5. While setting the cylinder setting temperature as shown in Table 13, the mixture was supplied into the cylinder of the twin-screw extruder PMT-47 through the upstream-side supply port, and glass fibers were further supplied through a downstream-side supply port and then was melt-extruded to obtain a strand of a liquid-crystalline polyester resin composition, which was then cut to produce pellets thereof.

Using the obtained pellets, a test piece and an ASTM No. 4 dumbbell of the liquid-crystalline polyester resin composition were obtained in the same manner as in Example 1 except that the injection-molding temperature was changed from 340° C. to 360° C. The results of the reflectance and tensile strength measured using the test piece and dumbbell are shown in Table 5. Also, the setting temperatures of all the heating devices of the twin-screw extruder are shown respectively in Table 7.

Example 14

A titanium oxide filler was mixed with the liquid-crystalline polyester 2 used in Example 9 in the amounts shown in Table 5. While setting the cylinder setting temperature as shown in Table 5, and the mixture was supplied into the cylinder of the twin-screw extruder TEM 41SS through the upstream-side supply port, and glass fibers were further supplied through a downstream-side supply port, and then was melt-extruded to obtain a strand of a liquid-crystalline polyester resin composition, which was then cut to produce pellets thereof.

Using the obtained pellets, a test piece and an ASTM No. 4 dumbbell of the liquid-crystalline polyester resin composition were obtained in the same manner as in Example 1 except that the injection-molding temperature was changed from 340° C. to 360° C. The results of the reflectance and tensile strength measured using the test piece and dumbbell are shown in Table 5. Also, the setting temperatures of all the heating devices of the twin-screw extruder are shown respectively in Table 8.

TABLE 5

|  |  | Example 9 | Example 10 | Comparative Example 5 | Example 11 | Example 12 | Comparative Example 6 | Example 13 | Example 14 |
|---|---|---|---|---|---|---|---|---|---|
| Liquid-crystalline polyester 2 | wt % | 100 | 100 | 100 | 100 | 100 | 100 | 100 | 100 |
| CR-60 | wt % | 40 | 40 | 40 | — | — | — | — | — |
| CR-58 | wt % | — | — | — | 55 | — | — | 55 | 55 |
| SR-1 | wt % | — | — | — | — | 40 | 40 | — | — |
| EFH 75-01 | wt % | 60 | 60 | 60 | — | 60 | 60 | — | — |
| EFDE 50-01 | wt % | — | — | — | 27 | — | — | 27 | 27 |
| Granulator |  |  |  | PCM30 |  |  |  | PMT47 | TEM41SS |
| Cylinder setting temperature | ° C. | 340 | 350 | 360 | 340 | ○ | 94 | 338 | 325 |
| Molding temperature | ° C. | 360 | 360 | 360 | 360 | — | — | 360 | 360 |
| Reflectance (%) | 460 nm | 72.7 | 72.8 | 72.4 | 78.9 | — | — | 81.9 | 81.9 |
| Granulation |  | ○ | ○ | x | ○ | ○ | x | ○ | ○ |
| Tensile strength | MPa | 84 | 85 | — | 94 | 87 | — | 114 | 115 |

TABLE 6

| Heating device | Setting temperature (° C.) | | | |
|---|---|---|---|---|
| | Examples 9 and 12 | Example 10 | Comparative Examples 5 and 6 | Example 11 |
| C1 | 320 | 330 | 330 | 320 |
| C2 | 340 | 350 | 360 | 340 |
| C3 | 340 | 350 | 360 | 340 |
| Nozzle | 340 | 350 | 360 | 340 |
| Average temperature of C2 and C3 | 340 | 350 | 360 | 340 |

TABLE 7

| Heating device | Setting temperature (° C.) Example 13 |
|---|---|
| C11 | 250 |
| C12 | 330 |
| C13 | 330 |
| C14 | 330 |
| C15 | 340 |
| C16 | 340 |
| C17 | 340 |
| C18 | 340 |
| C19 | 340 |
| Nozzle (dice) | 350 |
| Average temperature of C14 to C19 | 338 |

TABLE 8

| Heating device | Setting temperature (° C.) Example 14 |
|---|---|
| C21 | 250 |
| C22 | 310 |
| C23 | 310 |
| C24 | 320 |
| C25 | 320 |
| C26 | 320 |
| C27 | 320 |
| C28 | 320 |
| C29 | 330 |
| C30 | 330 |
| C31 | 330 |
| C32 | 330 |
| Nozzle (dice) | 340 |
| Average temperature of C25 to C32 | 325 |

What is claimed is:

1. A method for producing a liquid-crystalline polyester resin composition, the method comprising:
   providing a twin-screw extrusion granulator that comprises a cylinder provided with at least one supply port and two screws installed in the cylinder, and a heater for heating the cylinder;
   supplying
   (A) a liquid-crystalline polyester and
   (B) a titanium oxide filler into the cylinder through one of the at least one supply port; and
   melt-kneading the components (A) and (B),
   wherein the heater heats the cylinder to a temperature of (Tm−10)° C. or lower wherein Tm is a fluidization temperature of the component (A).

2. The method according to claim 1, wherein the component (B) is used in an amount of 20 to 120 parts by weight based on 100 parts by weight of the component (A).

3. The method according to claim 1, wherein the component (B) has a volume-average particle diameter within the range of from 0.1 to 0.5 μm.

4. The method according to claim 1, wherein the component (B) is a filler comprising a material made of titanium oxide produced by a chlorine process.

5. The method according to claim 1, wherein the component (B) is a titanium oxide filler surface-treated with aluminum oxide.

6. The method according to claim 1, further comprising supplying (C) an inorganic filler other than the titanium oxide filler.

7. The method according to claim 6, wherein the component (C) is supplied into the cylinder through a supply port located downstream from the supply port for supplying the components (A) and (B).

* * * * *